United States Patent
Coumou et al.

(10) Patent No.: US 9,721,758 B2
(45) Date of Patent: Aug. 1, 2017

(54) UNIFIED RF POWER DELIVERY SINGLE INPUT, MULTIPLE OUTPUT CONTROL FOR CONTINUOUS AND PULSE MODE OPERATION

(71) Applicant: MKS Instruments, Inc., Andover, MA (US)

(72) Inventors: David J. Coumou, Webster, NY (US); Ross Reinhardt, Rochester, NY (US); Yuiry Elner, Pittsford, NY (US); Daniel M. Gill, Macedon, NY (US)

(73) Assignee: MKS Instruments, Inc., Andover, MA (US)

( * ) Notice: Subject to any disclaimer, the term of this patent is extended or adjusted under 35 U.S.C. 154(b) by 218 days.

(21) Appl. No.: 14/797,347

(22) Filed: Jul. 13, 2015

(65) Prior Publication Data

US 2017/0018926 A1    Jan. 19, 2017

(51) Int. Cl.
*H01J 37/32* (2006.01)
*H05H 1/46* (2006.01)

(52) U.S. Cl.
CPC .. *H01J 37/32183* (2013.01); *H01J 37/32082* (2013.01); *H01J 37/32174* (2013.01); *H05H 2001/4682* (2013.01)

(58) Field of Classification Search
CPC ............... H01J 37/32082; H01J 37/32174
USPC ....................................................... 307/106
See application file for complete search history.

(56) References Cited

U.S. PATENT DOCUMENTS

| | | |
|---|---|---|
| 2,745,067 A | 5/1956 | True et al. |
| 3,117,279 A | 1/1964 | Ludvigson et al. |
| 3,443,231 A | 5/1969 | Roza |
| 3,601,717 A | 8/1971 | Kuecken |
| 6,417,732 B1 | 7/2002 | Radomski et al. |
| 6,818,562 B2 | 11/2004 | Todorow et al. |
| 6,887,339 B1 | 5/2005 | Goodman et al. |
| 7,199,678 B2 | 4/2007 | Matsuno |
| 7,917,104 B2 | 3/2011 | Manssen et al. |
| 8,217,731 B2 | 7/2012 | McKinzie, III |
| 8,264,154 B2 | 9/2012 | Banner et al. |
| 8,576,013 B2 | 11/2013 | Coumou |

(Continued)

FOREIGN PATENT DOCUMENTS

JP    3183914 B2    7/2001

OTHER PUBLICATIONS

Advanced Energy Industries, Inc. "AE Paramount Generator: 13.56 MHz" User Manual, Sep. 2009.

(Continued)

*Primary Examiner* — Robert Deberadinis
(74) *Attorney, Agent, or Firm* — Harness, Dickey & Pierce, P.L.C.

(57) ABSTRACT

A radio frequency (RF) control system including a RF generator having a power amplifier that outputs a RF signal and a controller. A matching network receives the RF signal and generates a plurality of RF output signals. The matching network includes a ratio tuning element to vary a ratio of power between the plurality of RF output signals. The first controller communicates a ratio control signal to the matching network, and the matching network controls the ratio tuning element in accordance with the ratio control signal. The RF controls system operates in a continuous and pulse mode of operation. The controller can also control the rise or fall of a pulse edge or a level or duration of incremental changes in the pulse edge.

46 Claims, 7 Drawing Sheets

(56) References Cited

U.S. PATENT DOCUMENTS

| | | |
|---|---|---|
| 9,408,288 B2 | 8/2016 | Valcore, Jr. et al. |
| 9,536,749 B2 | 1/2017 | Marakhtanov et al. |
| 2008/0061901 A1 | 3/2008 | Gilmore |
| 2008/0158076 A1 | 7/2008 | Walley |
| 2008/0274706 A1 | 11/2008 | Blin |
| 2009/0278512 A1 | 11/2009 | Karlicek et al. |
| 2009/0284156 A1 | 11/2009 | Banna et al. |
| 2012/0104950 A1 | 5/2012 | Banna et al. |
| 2013/0027132 A1 | 1/2013 | Retz et al. |
| 2014/0118031 A1 | 5/2014 | Rughoonundon et al. |
| 2014/0306742 A1 | 10/2014 | Menzer et al. |

OTHER PUBLICATIONS

Advanced Energy Industries, Inc. "AE Paramount@ VHF" User Manual, Feb. 2012.

Advanced Energy Industries, Inc. "Optimized Process Performance Using the Paramount™/Navigator® Power-Delivery/Match Solution" Dan Carter, Advanced Energy® Industries, Inc.

International Search Report for Application No. PCT/US2016/041312 dated Oct. 12, 2016.

UNIFIED RF POWER DELIVERY SINGLE INPUT, MULTIPLE OUTPUT CONTROL FOR CONTINUOUS AND PULSE MODE OPERATION

FIELD

The present disclosure relates to radio frequency (RF) power delivery systems and to centralized control of RF impedance matching networks.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In the RF power supply field, there are typically two approaches to applying the RF signal to the load. A first, more traditional approach is to apply a continuous wave signal to the load. In a continuous wave mode, the continuous wave signal is typically a sinusoidal wave that is output continuously by the power supply to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In the typical RF power supply configuration, output power applied to the load is determined by using sensors that measure the forward and reflected power or the voltage and current of the RF signal applied to the load. Either set of these signals is analyzed in a typical feedback loop. The analysis typically determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load.

As plasma systems have evolved, many new challenges exist to meet the specifications required to meet critical manufacturing specifications for both continuous wave and pulsed RF control. One advance includes applying a single output from the RF generator to a matching network and providing multiple RF feeds to plasma chambers to allow for increased control of various plasma parameters. In an exemplary configuration, a RF generator provides a single input to the matching network, and the matching network provides multiple RF feeds to corresponding multiple electrodes of one or multiple plasma chambers.

Further, the transition from continuous wave RF power delivery systems to pulse RF power delivery systems presents additional challenges. In a typical plasma system, the power dissipated in the plasma depends upon the impedance of the plasma. If the impedance varies in relation to the timescale of the RF pulse (typically in the range of 1 kHz-10 kHz), so as to not extinguish the plasma between pulse events, the sensors and actuators in the matching network and generator must respond on a similar timescale to provide optimal power coupling to the plasma load. Further, the time response of the impedance is plasma dependent and varies in accordance with factors such as chemistry, pressure, and power coupling. Further yet, the various parasitic elements outside of the plasma, such as resistive loss in the RF coupling antenna or the match system, present a time varying power coupling efficiency during the pulse cycle because they are a constant dissipated impedance in series with a time varying impedance load. Further yet, because the transmitted and reflected power sensors and RF generators are typically calibrated for a matched termination, power compensation due to impedance mismatch can contribute to increased variability in power delivery.

In the present, conventional control approach, the RF power supply and the matching network function independently. The RF power supply controls the RF output to the matching network, and the matching network independently controls tuning of the match elements to provide an impedance match. The matching network also controls the relative output between the multiple outputs from the matching network applied to the respective multiple electrodes of the one or multiple plasma chambers.

The conventional approach has various cost and complexity limitations in connection with both continuous wave and pulse mode operation. For example, the RF metrology requirements for the input and output of the impedance matching device are increased. Further, for frequency tuning systems, the RF metrology of the impedance matching network requires frequency tracking to scale the sampled RF to the operating frequency and synchronization with the RF generator to alleviate aliasing and control latency issues. The conventional approach also requires that the matching network includes computing resources to perform the ratio control functionality, also adding cost and complexity. Further yet, and further adding cost and complexity, in order to minimize undesirable RF transients, the RF generator and matching network must be coordinated for proper RF power regulation. Present, conventional systems also require synchronization of the RF output measurements, which typically occurs at the matching network. The above challenges are further increased in connection with pulse mode operation.

SUMMARY

This section provides a general summary of the disclosure, and is not a comprehensive disclosure of its full scope or all of its features.

A radio frequency (RF) control system having a RF generator including a power amplifier that outputs a RF signal. The RF generator also including a first controller. A matching network receiving the RF signal. The matching network generates a plurality of RF output signals to a plurality of loads. The matching network including a ratio tuning element to vary a ratio of power between a first of the plurality of RF output signals and a second of the plurality of RF output signals or a value obtained from selected ones of the plurality of RF output signals. The first controller communicates a ratio control signal to the matching network, and the matching network controls the ratio tuning element in accordance with the ratio control signal.

A radio frequency (RF) control system includes a RF generator having a power amplifier that outputs a RF signal. The RF generator generates a RF output signal to a matching network receiving the RF signal. The matching network provides a plurality of RF output signals to a plurality of loads. The matching network includes a ratio tuning element to vary a ratio of power between a first of the plurality of RF output signals and a second of the plurality of RF output signals or a value obtained from selected ones of the plurality of RF output signals. A controller communicates a ratio control signal to the matching network, wherein the matching network controls the ratio tuning element in accordance with the ratio control signal.

A controller for a radio frequency (RF) control system having a RF generator including a power amplifier that outputs a RF signal to a matching network. The matching network generates a plurality of RF output signals to a plurality of loads. The matching network includes a ratio tuning element to vary a ratio of power between a first of the plurality of RF output signals and a second of the plurality of RF output signals or a value obtained from selected ones of the plurality of RF output signals. The controller communicates a ratio control signal to the matching network. The matching network controls the ratio tuning element in accordance with the ratio control signal.

A controller for a radio frequency (RF) control system including a RF generator having a power amplifier that outputs a RF signal. The RF generator provides an output signal to a matching network. The matching network generates an RF output signal to a load. The matching network includes an impedance tuning element to vary a pulse edge of a pulsed RF signal. The controller communicates a pulse edge control signal to the matching network. The matching network controls the impedance tuning element in accordance with the pulse edge control signal.

A method for controlling a radio frequency (RF) control system includes communicating a ratio control signal to a matching network. The matching network controls a ratio tuning element in accordance with a ratio control signal. The matching network receives an RF signal and generates a plurality of RF output signals to a plurality of loads. The matching network varies a ratio of power between a first of the plurality of RF output signals and a second of the plurality of RF output signals in accordance with the ratio control signal.

A method for controlling a radio frequency (RF) system includes communicating a pulse edge control signal to a matching network. The matching network controls an impedance tuning element in accordance with the pulse edge control signal to vary a pulse edge of a pulsed RF signal. The matching network receives an RF signal and generates a plurality of RF output signals to vary a ratio of power between a first of the plurality of RF output signals and a second of the plurality of RF output signals or a value obtained from selected ones of the plurality of RF output signals in accordance with the pulse edge control signal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings, and reference numbers may be reused to identify similar and/or identical elements.

DETAILED DESCRIPTION

Figure 1:
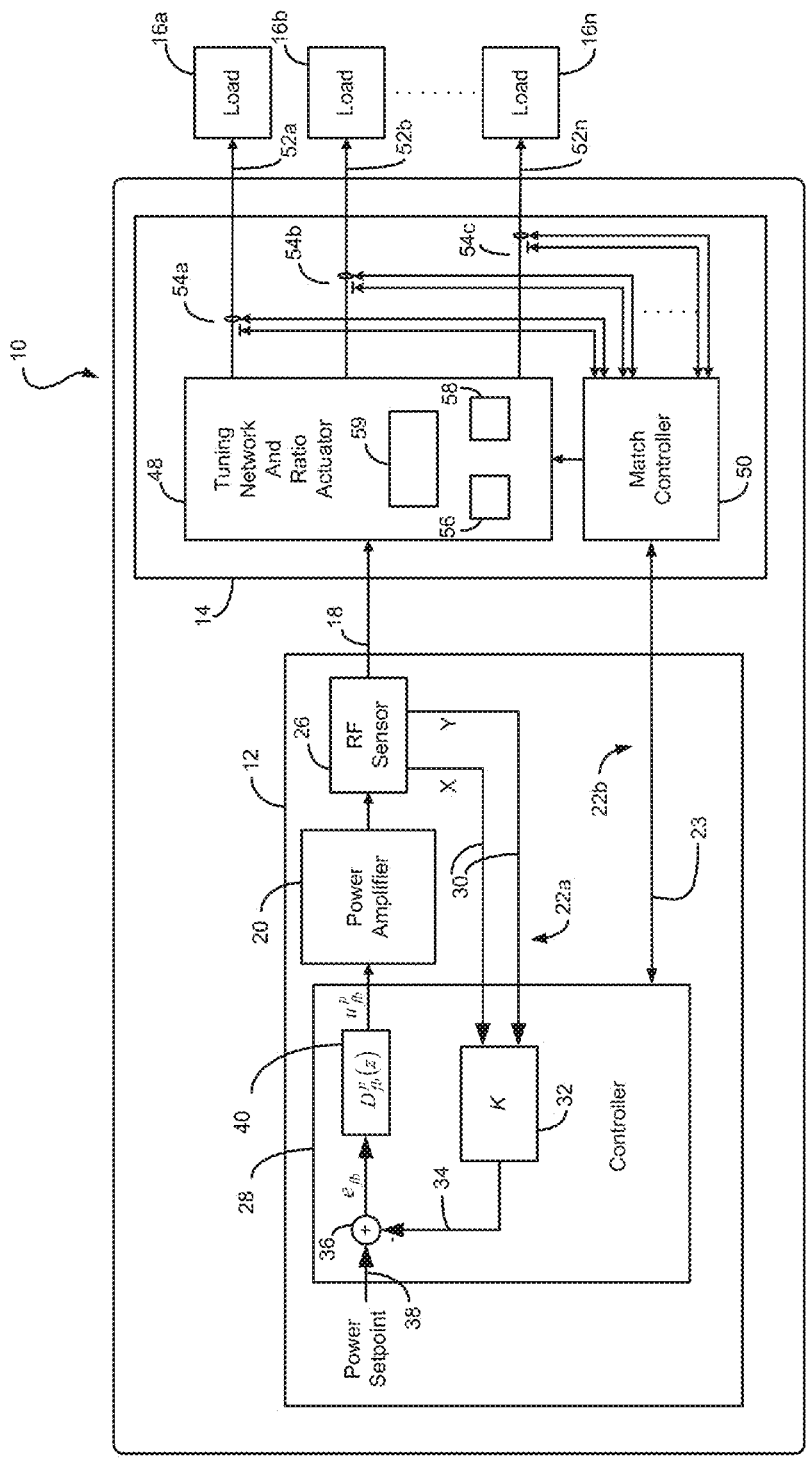
FIG. 1 depicts a functional block diagram of the RF power delivery control system incorporating the unified RF power delivery single input, multiple output control in accordance with the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In FIG. 1, a RF power system including a RF control or power system 10 is shown. RF power system 10 includes a RF generator 12, a matching network 14, and a plurality of loads 16a, 16b, . . . , 16n (referred to collectively as load 16) of the matching network 14. RF generator 12 generates a RF power signal 18, which is provided to matching network 14. Matching network 14 matches an input impedance of matching network 14 to a characteristic impedance of a transmission line between the RF generator 12 and matching network 14. Put another way, matching network 14 matches an impedance of load 16 to an impedance as seen by the output of RF generator 12. Matching network 14 and load 16 may be considered as the load on the RF generator 12. Loads 16a, 16b, . . . , 16n may be, for example, a plasma chamber or other RF load, such one or multiple electrodes of one or multiple plasma chambers. The impedance of load 16 may be static (i.e. unchanging over time) or dynamic (i.e. changing over time).

RF generator 12 includes a RF power source or power amplifier 20 and a first or internal feedback loop 22a and a second or external feedback loop 22b. Power amplifier 20 generates RF power signal 18, which is output to matching network 14. Power amplifier 20 may generate the RF power signal 18 based on a power signal received from a power source (not shown) external to power amplifier 20. The power source may be external to the RF generator 12. The power source may be, for example, a direct current (DC) power source.

First or internal feedback loop 22a includes one or more sensors (first sensors) 26 that generate signals X and Y (also 30) input to controller 28 of power amplifier 20. Internal feedback loop 22a also includes a scaling module 32, a summer 36, and a power control module 40. Sensors 26 may include voltage, current, and/or directional coupler sensors. Sensors 26 may detect (i) voltage V and current I output of power amplifier 20, and/or (ii) forward (or source) power $P_{FWD}$ out of power amplifier 20 and/or RF generator 12 and reverse (or reflected) power $P_{REV}$ received from matching network 14. The voltage V, current I, forward power $P_{FWD}$, and reverse power $P_{REV}$ may be scaled and/or filtered versions of the actual voltage, current, forward power and reverse power of the output of the power amplifier 20. The sensors 26 may be analog and/or digital sensors. In a digital implementation, the sensors 26 may include analog-to-digital (ND) converters and signal sampling components with corresponding sampling rates. Signals X and Y can represent any of the voltage V and current I or forward (or source) power $P_{FWD}$ reverse (or reflected) power $P_{REV}$.

Sensors 26 generate sensor signals X, Y, which are received by scaling module 32. Scaling module 32 scales sensor signals 30 and generates a power feedback signal 34. Power feedback signal 34 is generated based on the sensor signals 30 and a scaling matrix. The power feedback signal 34 may, for example, represent the forward power for forward power leveling power delivery. Power feedback signal 34 may represent the RF power transferred to the matching network 14 or load power $P_d$ and can be represented by equation (1), where V is voltage output of the power amplifier 20 and/or RF generator 12, I is current out of the power amplifier 20 and/or RF generator 12, and Q is a phase difference between the voltage and the current outputs V, I of the power amplifier 20.

$$P_d=|V||I|\cos(\Theta)=P_{FWD}-P_{REV} \qquad (1)$$

Summer 36 sums the power feedback signal 34 with a predetermined power setpoint signal 38, which may be generated by a power setpoint module (not shown). Power feedback signal 34 may be subtracted from the predetermined power setpoint signal 38 to generate an error signal $e_{fb}$.

Power control module 40 receives the error signal $e_{fb}$, and generates a power control signal $u_{fb}^P$ to regulate power out of power amplifier 20. Power control signal $u_{fb}^P$ is provided to power amplifier 20. Power amplifier 20 adjusts RF power signal 18 based on power control signal $u_{fb}^P$. RF power signal 18 may be a continuous waveform or a pulse waveform. Power control module 40 may include a proportional integral derivative (PID) controller or subset thereof and/or a direct digital synthesis (DDS) component(s). In various implementations, power control module 40 is a first PID controller or subset thereof with a function identified as $D_{fb}^P(z)$. Power control signal $u_{fb}^P$ may be a drive signal and have a DC offset or rail voltage, a frequency, and a phase.

Matching network 14 includes a tuning and ratio actuator 48 and a match controller 50. Tuning network and ratio actuator 48 includes tuning elements for varying the impedance at the output of RF generator 12 in order to respond to variations in load 16 and maintain a stable impedance at the output of RF generator 12. Tuning network and ratio actuator 48, for example, includes one or both of a first match tuning element 56 and a second match tuning element 58, each of which are adjustable in order to vary the impedance at matching network 14 to maintain a match condition. In various embodiments, tuning network and ratio actuator 48 includes one or both of a load capacitance that corresponds to first tune element 56 and a tune capacitance that corresponds to second tune element 58. Each of the tune capacitance and the load capacitance are adjustable in order to vary the impedance at matching network 14 to tune to and maintain a match condition. Tuning network and ratio actuator 48 also includes one or more ratio tuning element 59. Ratio element 59 enables tuning network and ratio actuator 48 to vary the output of RF power output to selected transmission lines 52a, 52b, . . . , 52n applied to the respective loads 16a, 16b, . . . , 16n to achieve predetermined target ratios, as will be described in greater detail.

Matching network 14 also includes a plurality of RF sensors 54a, 54b, . . . , 54c (referred to collectively as sensor 54) associated with respect of transmission lines 52a, 52b, . . . , 52n for sensing the respective characteristics of the RF power output by tuning network and ratio actuator 48. RF sensors 54 operate similarly as described with respect to RF sensor 26 of RF generator 12. RF sensors 54a, 54b, . . . , 54c generate signals that vary in accordance with the RF power applied to the respective transmission lines 52a, 52b, . . . , 52c, and the signals are input to match controller 50. Match controller 50 communicates a characteristic signal that varies in accordance with the information sensed by respective RF sensors 54 to controller 28 of RF generator 12 over communication link 23.

Various techniques are disclosed herein that include maximizing optimal power transfer in a RF power system with a dynamic load (i.e. a load having varying impedance(s)). A first technique includes RF power amplifier 20 connected to matching network 14. Matching network 14 may include an impedance matching network and ratio actuator 48 to effect one or both ratio control between any two selected loads 16a, 16b, . . . , 16n and impedance matching between RF generator 12 match network 14.

For example, tuning network and ratio actuator 48 includes two or more variable tuning elements 56, 58, such as variable capacitors. Variable tuning elements 56, 58 may be in a 'L'-configuration (one load capacitance in parallel with RF generator 12 and one tune capacitance in series with load 16). Variable tuning elements 56, 58 adjust tune and load parameters of the matching network 14, and may have respectively an associated tune input and load input. The tune and load parameters refer to impedance adjustments performed in matching network 14 via the variable tuning elements. As an example, the tune parameter and the load parameter may be associated with respective capacitances of capacitors in matching network 14. In various embodiments, a second technique introduces a variable frequency adjustment to the power amplifier 20 and may be used alternatively or in combination with the first technique. The tune and load parameters may each be fixed, discretely selectable, and/or adjustable when using the second technique.

In both the first and second techniques, the RF power transferred $P_d$ from the power amplifier 20 to the matching network 14 is maximized. This may occur when the forward power $P_{FWD}$ to the matching network 14 is maximized and/or the reverse power $P_{REV}$ from the matching network is minimized. The RF power transferred $P_d$ may be represented by equation (2). A maximum RF power transferred $P_{MAX}$ may be represented by equation (3).

$$P_d = |V||I|\cos(\Theta) \quad (2)$$

$$P_{MAX} = \max(|V||I|\cos(\Theta)) = \max(P_{FWD}) - \min(P_{REV}) \quad (3)$$

The RF power transferred $P_d$ is maximized when the phase $\Theta$ is as close to zero as systematically achievable for a RF power system 10 providing power to a reactive load or reactive impedance (e.g. load 16). A reactive impedance refers to a load with changing impedance. The first and second techniques minimize the phase $\Theta$ by adjusting the tune and load parameters of the matching network 14. Since the phase $\Theta$ is dependent on the reactive impedance, reduction in the phase $\Theta$ is a function of frequency f of the power amplifier 20. As a result, phase reduction can be performed as a function of the frequency f or in other words, the phase $\Theta$ can be reduced to or nearly 0 by adjusting the frequency f of the power amplifier 20 and thus the output frequency f of the power amplifier 20.

As mentioned above, RF generator 12 also includes a second or external feedback loop 22b. Second feedback loop 22b includes sensor 54, match controller 50, and power control module 40 of controller 28. As described above, sensor 54 generates signals similar to X and Y output by RF sensor 26. The signals output by sensor 54 are input to match controller 50. Match controller 50 processes the received signals and outputs information characteristic of the signals to controller 28 of RF generator 12. The information output by match controller 50 is output in a digital format to controller 28.

In a conventional configuration, a matching network operates independently of the RF generator includes circuitry to adjust the respective tuning element or elements in accordance with the determined match condition. Likewise, in a conventional configuration, the matching network will receive commands from an external source about the desired, predetermined ratio of the output applied to respective loads 16a, 16b, . . . , 16n. The matching network will independently determine the characteristics of the output applied to respective loads 16a, 16b, . . . , 16n and determine the appropriate adjustment in order to achieve the target ratios. This above-described conventional configuration presents certain challenges described in the background section above.

In the various embodiments described in the present disclosure, however, RF generator 12 controls both the tuning elements 56, 58 and the output ratio element 59 in a unified manner by controller 28 of RF generator 12. Control of the first tuning element 56 and second tuning element 58 is described in U.S. Pat. No. 8,576,013 entitled Power Distortion-Based Servo Control Systems for Frequency Tuning RF Power Sources, granted Nov. 5, 2013, and assigned to the assignee of the present application. Control of the first tuning element 56 and second tuning element 58 can occur when controller 28 outputs communicates a tune control signal to match controller 50 to effect tuning of the respective first tuning element 56 and second tuning element 58. In various embodiments, power control module 40 of controller 28 controls the power ratio of the RF outputs from matching network 14 applied to respective loads 16a, 16b, . . . , 16n.

Power control module 40 of controller 28 utilizes the information received from match controller 50, in second feedback loop 22b, received from RF sensor 54. Match controller 50 communicates with controller 28 in various embodiments at fixed data rates and link latency to provide information characterizing the outputs to load 16. From these values, RF generator 12 computes a ratio for a particular output $y_r$ (i) (such as to one or more loads 16a, 16b, . . . , 16n) relative to the sum of all outputs as described in equation (4):

$$\sigma_r(i) = \frac{\xi_{m(i)}}{\Sigma_{\forall n} \xi_{n(i)}} \quad (4)$$

where, m is a first output from matching network 14, n is an $n^{th}$ output from matching network 14, $\xi$ is the $i^{th}$ voltage or current value pertaining to a desired output ratio, $x_r$, for the corresponding matching network m of n outputs.

In various other embodiments, RF generator 12 computes the ratio for a particular output $\sigma_r(i)$ relative to a second output as described in equation (5):

$$\sigma_r(i) = \frac{\xi_{m(i)}}{\xi_{n(i)}} \quad (5)$$

where m, n, and $\xi$ are as described above.

Power control module 40 utilizes a digital controller $D_{fb}^P(z)$ to iteratively calculate the actuator position $\lambda$ based on the error e(i) as described in equation (6):

$$e(i) = x_r - \sigma_r(i) \quad (6)$$

where $x_r$ and $\sigma_r(i)$ are as described above. In various embodiments, power control module 40 implements a proportional control approach to determine actuator position $\lambda$. Proportional control for the computation of the actuator position $\lambda$ can be described as shown in equation (7)

$$\lambda(i+1) = \lambda(i) + Ge(i) \quad (7)$$

where, $\lambda(i+1)$ is the new calculated value of $\lambda$, $\lambda(i)$ is a the prior calculated value of $\lambda$, and G is a variable or constant parameter for the proportional or gain control equation.

Increased control can be achieved using a higher order proportional-internal-derivative control approach as described in equation (8):

$$\lambda(i+1) = \lambda(i) + G[\alpha e(i) + \beta e(i-1) + \gamma e(i-2)] \quad (8)$$

where, $\lambda(i+1)$, $\lambda(i)$, and G are as described above, e(i−1) and e(i−2) are the first and second respective prior error terms, $\alpha$, $\beta$, and $\gamma$ are variable or constant terms for the control equation.

The unified ratio control approach described above may be generalized to both the continuous wave and a pulse mode operation of RF generator 12. However, pulse mode operation introduces other considerations that must be addressed in order to effectively implement unified ratio control. Sampling of the waveform of the RF output applied to loads 16 and information to be communicated from match controller 50 to controller 28 are considered in connection with FIGS. 2-9. When the output from RF generator 12 is pulsed, sampled signals from sensor 54 are asynchronous to the RF output from power amplifier 20. A signal reconstructed from the pulse signals at the outputs of matching network 14 to transmission line 52 will be phase shifted with respect to the pulse output from RF generator 12. Accordingly, FIGS. 2-9 described an approach in which controller 28 reconstructs a pulse mode signal output from matching network 14 while accounting for the asynchronous nature of the reconstruction.

Figure 2:
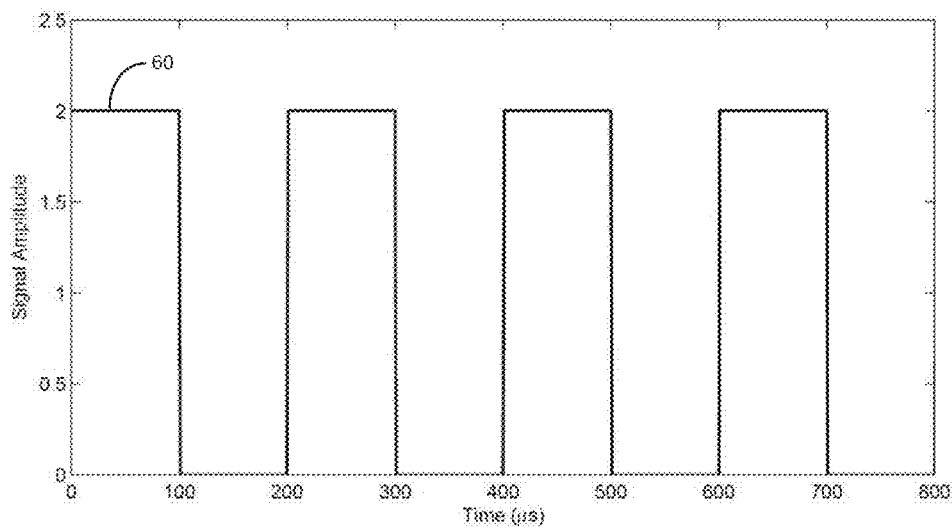
FIG. 2 depicts a waveform of an exemplary output pulse to be reconstructed in accordance with the present disclosure.
Figure 3:
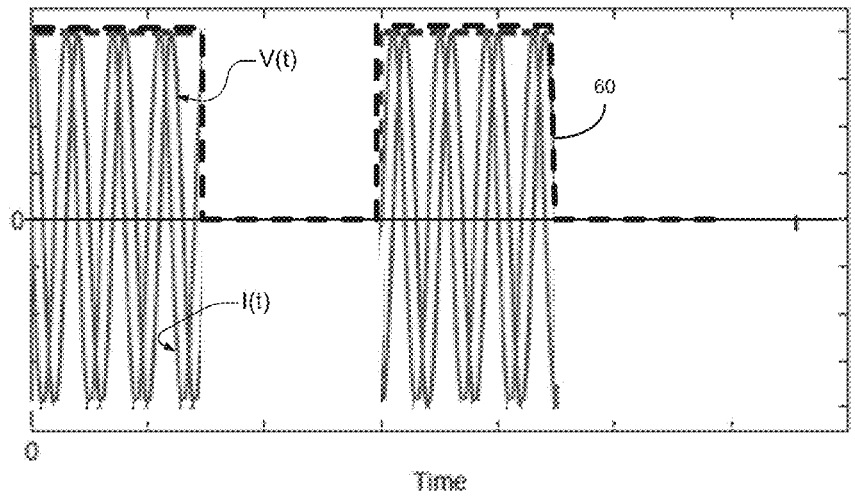
FIG. 3 depicts a pulse and exemplary waveforms bounded by the pulse in accordance with operation of a RF generator in a pulse mode of operation.
Figure 4:
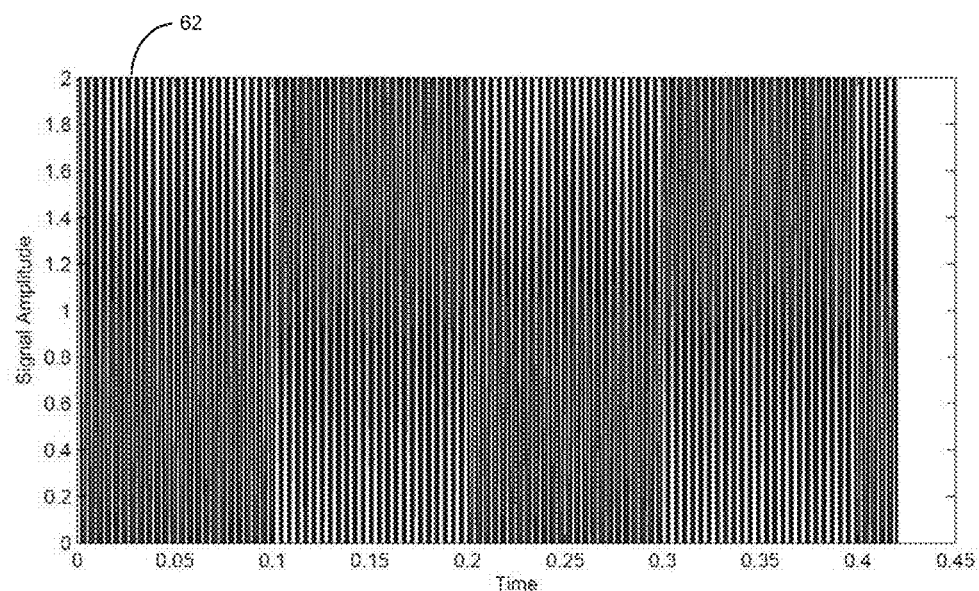
FIG. 4 depicts an exemplary, aliased waveform of the output pulse of FIG. 2.
Figure 5:
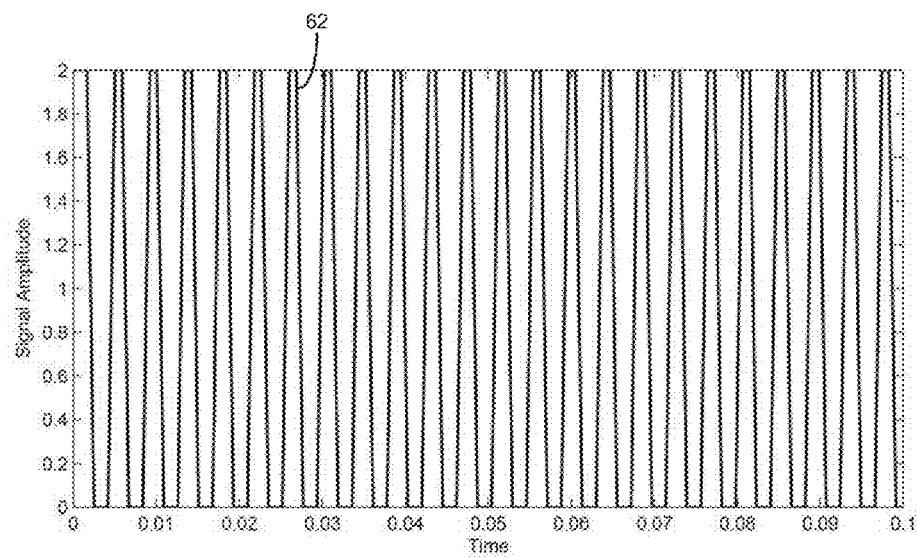
FIG. 5 depicts the waveform of FIG. 4 having an expanded time scale.

FIG. 2 depicts a pulse waveform 60, such as may be output on transmission line 52. FIG. 3. depicts a general representation of a pulse waveform 60. As can be seen in FIG. 3, pulse waveform 60 provides an envelope for a sinusoidal voltage signal V(t) and sinusoidal current signal I(t), so that when waveform 60 is on, the sinusoidal signals V(t) and I(t) are bounded by waveform 60 and may be output. When waveform 60 is off (having an amplitude of zero), no output occurs and sinusoidal signals V(t) and I(t) are both zero. In one non-limiting example, as shown in FIG. 2, pulse waveform 60 has a frequency or pulse repetition frequency (PRF) of 500 kHz, or a pulse rate time ($t_p$) of 200 µs. That is $t_p = PRF^{-1}$. If pulse waveform 60 is sampled at a sampling rate of 1110 Hz, i.e., the sampling time $t_s = 1/1110$ s, an aliased representation 62 of pulse waveform 60 results, as shown in the waveforms of FIGS. 4 and 5, with FIG. 5 showing an expanded timescale of FIG. 4. Although pulse waveform 60 shown in FIG. 2, is represented as a square wave, pulse waveform 60 may be a square, sawtooth, triangular, bi-level or multi-level, and other wave shapes. Pulse waveform 60 is periodic in various embodiments.

Figure 6:
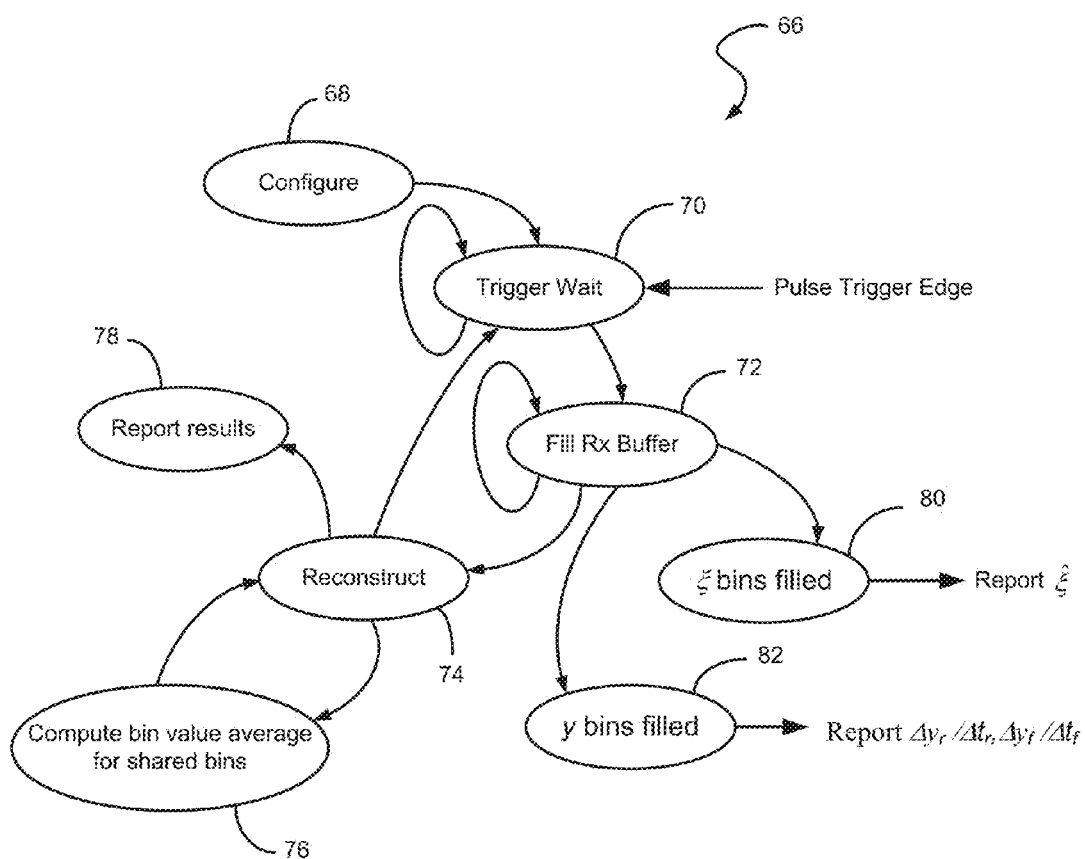
FIG. 6 depicts a state diagram of a portion of the RF power delivery control system incorporating the unified RF power delivery single input, multiple output control for reconstructing an output pulse and a pulse mode RF power delivery system.
Figure 7:
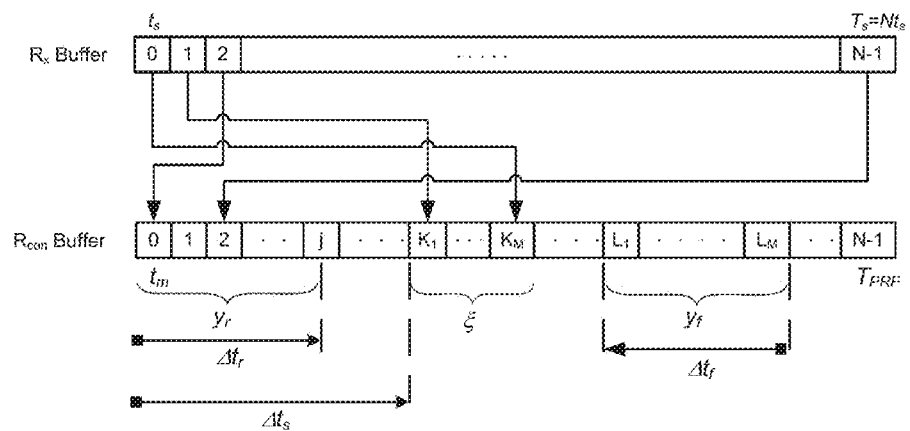
FIG. 7 depicts a receive buffer and a reconstruction buffer for reconstructing the RF output pulse signal.

The state diagram 66 of FIG. 6 depicts various embodiments for reconstructing pulse waveform 60. This reconstruction accounts for latency in the sample waveform and for the nature of the aliased representation 62 of waveform 60, as shown in FIGS. 4 and 5. The process commences at state 68 where initial configuration occurs. Controller proceeds to state 70. State 70 is a wait state for synchronizing the initial sampling in accordance with a pulse trigger edge. Upon detection of the pulse trigger edge, the process proceeds to state 72 in which sampling occurs at the sampling time $t_s$ (or sampling rate of 1110 Hz) and the samples are placed in a receive buffer $R_x$. An example of receive buffer $R_x$ is shown in FIG. 7. As seen in FIG. 7, receive buffer $R_x$ comprises N samples occurring every $t_s$ seconds and has total length of $T_s = Nt_s$ seconds. Each sample is placed in the appropriate position in receive buffer $R_x$ in accordance with particular time of the sampling relative to $t_s = 0$. The samples stored in receive buffer $R_x$ are redistributed into bins of a reconstruction buffer $R_{con}$, also shown in FIG. 7. Values from each position in receive buffer $R_x$ are redistributed into the appropriate N bins of reconstruction buffer $R_{con}$. The bins of the respective receive buffer $R_x$ and buffer $R_{con}$ buffer are of different widths. Reconstruction buffer $R_{con}$ comprises N bins, but has a width of $T_{PRF}=Nt_p$ seconds. Recall that for the example described herein, receive buffer $R_x$ has a length of $T_s=Nt_s$ seconds and that $t_p=200$ μs, while $t_s=901$ μs. Thus the bins of the reconstruction buffer $R_{con}$ and receive buffer $R_x$ are different sizes.

Filling reconstruction buffer $R_{con}$, occurs at state 74. A predefined transfer function, such as a modulus function provides a mapping from receive buffer $R_x$ to reconstruction buffer $R_{con}$ in accordance with equation (9)

$$t_m(n)=\mathrm{mod}(t_{s(n)},t_p), \text{ for } \forall \ n \text{ samples of } t_s \qquad (9)$$

Figure 8:
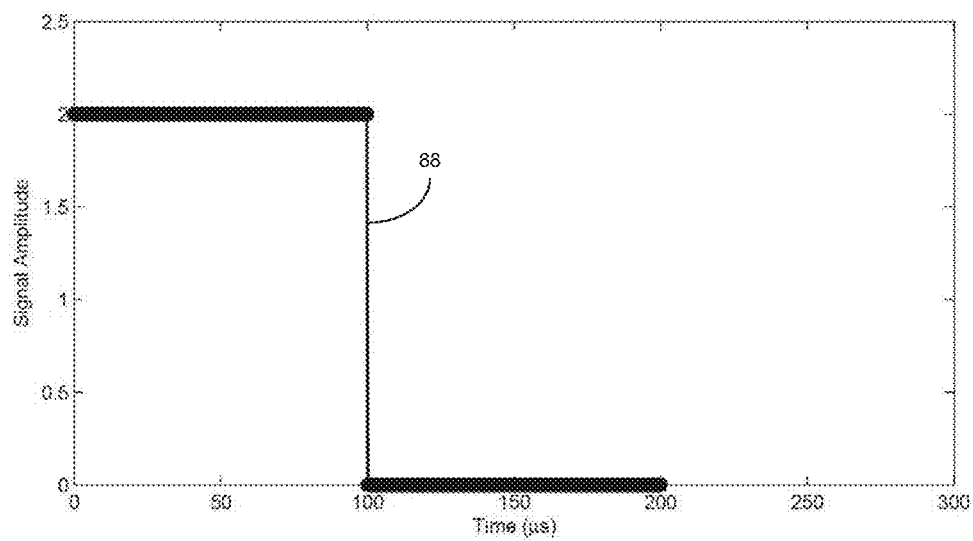
FIG. 8 depicts a single cycle of a waveform reconstructing from the waveform of FIG. 3 using the method depicted in the state diagram of FIG. 6.

Sorting $t_m(n)$ provides an index to assign received data in receive buffer $R_x$ to the appropriate time based bins of reconstruction buffer $R_{con}$. Alternatively, by applying $t_s^{-1}$ to $t_m$, the time based bins are constructed in terms of an index bin representation. Based on the pulse rate and the number of N samples acquired, a bin in reconstruction buffer $R_{con}$ may already contain a data value. When a bin in reconstruction buffer $R_{con}$ already contains a data value, the data is accumulated within the respective bin. After all data is received, control proceeds to state 76 where the data in each bin of reconstruction buffer $R_{con}$ is normalized by the number of samples accumulated in each bin. Normalization may occur by computing an average for each bin. After the acquisition of the entire N samples is completed, control returns to reconstruction state 74 where waveform is reconstructed. FIG. 8 depicts a waveform 88 reconstructed in accordance with the state diagram of FIG. 6. Once reconstruction buffer $R_{con}$ is filled, control can proceed to state 78 and results of the reconstruction process are reported.

Further review of reconstruction buffer $R_{con}$ of FIG. 7 facilitates recognizing a correspondence between different portions of reconstruction buffer $R_{con}$ and the waveform 60. More particularly, the bins of reconstruction buffer $R_{con}$ denoted by $y_r$ correspond to the rising portion of waveform 60 being reconstructed and are processed to yield the rise time $\Delta t_r$ of waveform 60. Similarly, the bins of reconstruction buffer $R_{con}$ denoted by $y_f$ correspond to the falling portion of the waveform 60 being reconstructed and are processed to yield the fall time $\Delta t_f$ of waveform 60. The bins of reconstruction buffer $R_{con}$ denoted by correspond to the steady state or ON portion of waveform 60 following the rise of waveform 60, and $\Delta t_s$ corresponds to the time for waveform 60 to settle to the steady state or ON portion. The samples $K_1 \ldots, K_M$ indicate the minimum number of bins to be filled in order to start the reconstruction process. Referring to state 80 of FIG. 6, once the $\xi$ bins are filled, $\xi$ can be reported and processing can proceed. Similarly, referring to state 82, when bins $y_r$ and $y_f$ are full, information regarding the respective rising and falling edges and the respective rise and fall times can be reported including, for example, respective derivatives of the rise and fall times, $\Delta y_r/\Delta t_r$ and $\Delta y_f/\Delta t_f$. The reported information can be information useful for further controlling RF power system 10, statistical information for operators, or other various uses. The reported information may be scalar values or data sequences, depending upon the particular implementation.

Figure 9:
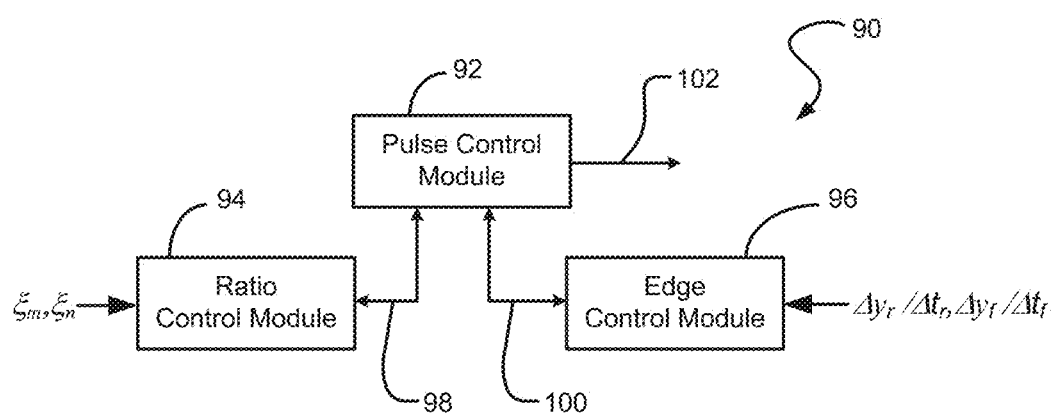
FIG. 9 depicts an expanded block diagram of control portion of the RF controller of FIG. 1.

FIG. 9 depicts an expanded block diagram 90 of power control module 40. In the expanded block diagram 90, power control module 40 includes a pulse control module or circuit 92, a ratio control module or circuit 94, and an edge control module or circuit 96. Pulse control module 92 communicates with ratio control module 94 via a communication 98. Pulse control module 92 communicates with edge control module 96 via a communication 100. Ratio control module 94 receives the respective voltage or current values pertaining to a desired output ratio, $\xi_m$ and $\xi_n$, as inputs, described above with respect to equations (4) and (5). Pulse control module 92 communicates with power amplifier 20 and match controller 50 of matching network 14 via communication link 102. Each of communication links 98, 100, 102 may be implemented as a digital or analog communication link and in various embodiments may be implemented generally in a bus structure. Further, in various embodiments, pulse control module 92, ratio control module 94, and edge control module 96 may communicate directly with match controller 50, such as over communication link 23, using independent communication links or a bus structure.

Upon receiving the $\xi_m$ and $\xi_n$ inputs, ratio control module 94 generates commands communicated to matching network 14 and match controller 50. Edge control module 96 receives the respective derivatives of the rise and fall times, $\Delta y_r/\Delta t_r$ and $\Delta y_f/\Delta t_f$, and generates an edge control signal providing commands to allow for edge control or the RF pulse. In various embodiments, edge control module 96 utilizes the derivatives of the rise and fall times to generate commands to adjust the position of one of first tune element 56 and second tune element 58. In various embodiments, edge control module 96 varies the position of a selected tune element 56 in order to determine the rate of the rise and fall times. By varying the sharpness of the rising or falling edges, more accurate control of the process occurring in load 16 is achieved. Such control can be independent of or coincident with frequency tuning to arrive at an appropriate match condition. In various embodiments, edge control module 96 generates commands used by match controller 50 to control the position of a tune capacitor, such as may be implemented by second tune element 58.

In various embodiments, edge control module 96 utilizes the respective derivatives of the rise and fall times, $\Delta y_r/\Delta t_r$ and $\Delta y_f/\Delta t_f$ input thereto and generates commands to vary the increase or decrease (or ramping) of RF signal 18 output by power amplifier 20 during transitions. Edge control module 96 generates commands to pulse control module 92, and pulse control module 92 generates commands directing power amplifier 20 to effect the appropriate increase or decrease (or ramping) of the pulse output by power amplifier 20. In various embodiments, edge control module 96 generates commands to vary one or both of the rising or falling edges of a pulse signal and the increase or decreasing (ramping) transition of the RF signal 18.

Figure 10:
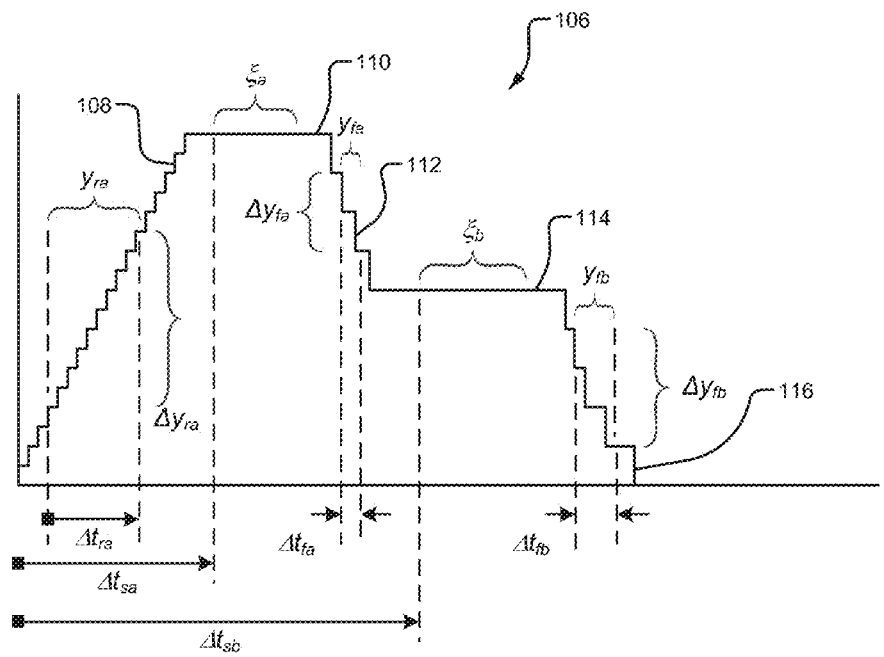
FIG. 10 is a more generalized representation of the reconstruction buffer of FIG. 7 for use in connection with a more generalized configuration of a pulse waveform.
Figure 11:
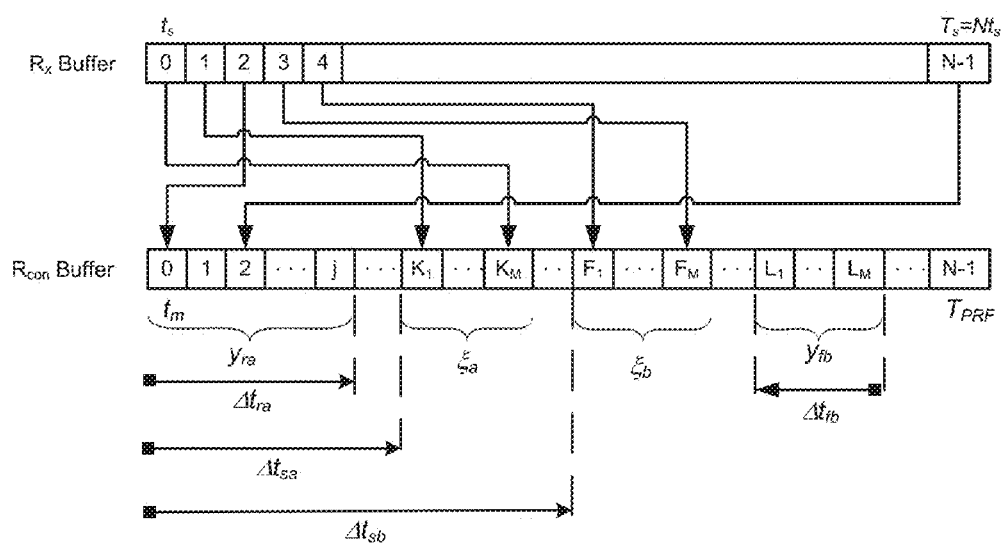
FIG. 11 depicts a multi-level pulse waveform quantities used to describe the reconstruction buffer in order to demonstrate the relationship between the sample pulse waveform and the reconstruction buffer.

FIG. 10 depicts a generalized representation of a multi-level pulse waveform, and FIG. 11 depicts a receive buffer and a reconstruction buffer. The quantities shown in each of FIGS. 10 and 11 are used to indicate the relationship between the pulse waveform and portions of the reconstruction buffer. The multi-level pulse waveform 106 of FIG. 11 includes a number of generally distinct portions. More particularly, multi-level pulse waveform 106 includes a first rising (transition) portion 108 starting at the time $t=0$ and rising to a first level 110. First level 110 corresponds to a settled or a steady state portion of multi-level pulse waveform 106. Multi-level pulse waveform 106 also includes a first falling (transition) portion 112. First falling (transition) portion 112 descends from first level 110 to a second level 114. Second level 114 corresponds to a settled or a steady state portion of multi-level pulse waveform 106. Multi-level pulse waveform 106 also includes a second falling (transition) portion 116. While multi-level pulse waveform 106 of FIG. 10 is shown as a two-level waveform, it should be recognized that multi-level pulse waveform 106 may be implemented having two or more levels, some of which may be zero or nonzero. In various embodiments, multi-level pulse waveform 106 may have multiple rising (transition) portions in addition to first rising (transition) portion 108.

In contrast to FIG. 7, FIG. 11 indicates two data sequences, $\xi_a$ and $\xi_b$, having respective values $K_1 \ldots, K_M$ and $F_1 \ldots, F_M$. Data sequences $\xi_a$ and $\xi_b$, as compared to the single data sequence $\xi$ of FIG. 7 enable the reconstruction of, for example, respective first level 110 and second level 114. As can be seen in FIGS. 10 and 11, data sequences $\xi_a$ and $\xi_b$ in the reconstruction buffer of FIG. 11 correspond to portions of respective first level 110 and second level 114. Thus, the data sequences of values $K_1 \ldots, K_M$ and $F_1 \ldots, F_M$ enable the determination of respective first portion 110 and second portion 114. It should be noted that, as shown in FIG. 10, data sequences $\xi_a$ and $\xi_b$ represent a selected section of respective first level 110 and second level 114. Thus, respective first level 110 and second level 114 can be determined by sampling a selected section of each level.

Also shown in FIG. 10, data sequence $y_{ra}$ corresponds to a selected section of first rising (transition) portion 108. The change in time $\Delta t_{ra}$ indicates the time duration of $y_{ra}$, and $\Delta y_{ra}$ indicates the change in amplitude of the of first rising portion 108. Similarly, data sequence $y_{fa}$ corresponds to a selected section of first falling (transition) portion 112. The change in time $\Delta t_{fa}$ indicates the time duration of $y_{fa}$, and $\Delta y_{fa}$ indicates the change in amplitude of the of first falling portion 112. Data sequence $y_{fb}$ corresponds to a selected section of first falling (transition) portion 114. The change in time $\Delta t_{fb}$ indicates the time duration of $y_{fb}$, and $\Delta y_{fb}$, indicates the change in amplitude of the of first falling portion 114. While no second rise (transition) portion of multi-level pulse waveform 106 is shown in FIG. 10, in various configurations of a multi-level pulse, each settled or steady-state section of a pulse can have an associated rise and fall for which similar quantities can be determined. As described above with respect to data sequences $\xi_a$ and $\xi_b$, reconstruction of each rising and falling section can be accomplished by sampling a subset or selected section of the respective rising and falling (transition) portions of multi-level multi-level pulse waveform 106.

With reference to FIG. 9, operation of edge control module 96 can be further described. As described above, edge control module generates commands to pulse control module 92, and pulse control module 92 generates commands directing power amplifier 20 to effect the appropriate increase or decrease (or ramping) of the pulse output by power amplifier 20. FIG. 10, with reference to portions 108, 112, and 114 of multi-level pulse waveform 106, provides a visual representation of controlling the increase or decrease (or ramping) of the pulse output by power amplifier 20. Rising portion 108 and falling portion 112 and 114 are depicted using a stair-stepped transition, where the amplitude or level) and duration of each increment or step can be varied by pulse edge controller to vary the ramping of each transition portion of multi-level pulse waveform 106. Controlling the stair-stepped transitions provides improved control of the pulse output by power amplifier 20. It should be recognized that the amplitude or level and duration of each increment or step of portions 108, 112, and 114 of multi-level can be independently determined.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A radio frequency (RF) control system comprising:
a RF generator including a power amplifier that outputs a RF signal, the RF generator also including a first controller;
a matching network receiving the RF signal, the matching network generating a plurality of RF output signals to a plurality of loads, the matching network including a ratio tuning element to vary a ratio of power between a first of the plurality of RF output signals and a second of the plurality of RF output signals or a value obtained from selected ones of the plurality of RF output signals; and
wherein the first controller communicates a ratio control signal to the matching network, and the matching network controls the ratio tuning element in accordance with the ratio control signal.

2. The RF control system of claim 1 where the matching network further includes a match tuning element to vary an impedance of an output of the RF generator and wherein the first controller communicates a tune control signal to the matching network, and the matching network controls the match tuning element in accordance with the tune control signal.

3. The RF control system of claim 2 wherein the matching network includes a second controller, the second controller receiving the ratio control signal and controlling the ratio tuning element in accordance with the ratio control signal and receiving the tune control signal and controlling the match tuning element in accordance with the tune control signal.

4. The RF control system of claim 1 wherein the matching network communicates a characteristic signal to the RF generator indicative of a characteristic of a respective RF output signal.

5. The RF control system of claim 4 wherein the first controller receives the characteristic signal and generates the ratio control signal in accordance with the characteristic signal.

6. The RF control system of claim 1 wherein the matching network includes a second controller, the second controller receiving the ratio control signal and controlling the ratio tuning element in accordance with the ratio control signal.

7. The RF control system of claim 1 wherein the RF generator operates in a continuous wave mode or a pulse mode.

8. A radio frequency (RF) control system comprising:
a RF generator including a power amplifier that outputs a RF signal, the RF generator generating a RF output signal to a matching network, the matching network generating a plurality of RF output signals to a plurality of loads, the matching network including a ratio tuning element to vary a ratio of power between a first of the plurality of RF output signals and a second of the plurality of RF output signals or a value obtained from selected ones of the plurality of RF output signals; and
a controller communicating a ratio control signal to the matching network, wherein the matching network controls the ratio tuning element in accordance with the ratio control signal.

9. The RF control system of claim 8 where the matching network further includes a match tuning element to vary an impedance at an output of the RF generator and wherein the controller communicates a tune control signal to the matching network, and the matching network controls the match tuning element in accordance with the tune control signal.

10. The RF control system of claim 8 wherein the matching network communicates a characteristic signal to the RF generator indicative of a characteristic of a respective RF output signal of the plurality of RF output signals.

11. The RF control system of claim 10 wherein the controller receives the characteristic signal and generates the ratio control signal in accordance with the characteristic signal.

12. The RF control system of claim 8 wherein the RF generator operates in a continuous wave mode or a pulse mode.

13. The RF control system of claim 12 wherein when operating in a pulse mode, the controller:
   stores samples of at least one of the plurality of the RF output signals in a receive buffer;
   transfers the stored samples to preselected bins in a reconstruction buffer in accordance with predefined transfer function; and
   reconstructs the at least one of the plurality of RF output signals in accordance with the samples and the reconstruction buffer.

14. The RF control system of claim 13 wherein if a selected bin in the reconstruction buffer has stored in at more than one sample, the controller determines an average for the samples in the selected bin.

15. The RF control system of claim 14 wherein the controller determines at least one of the following:
   a rise time of the at least one of the plurality of RF output signals in accordance with a first set of bins;
   a fall time of the at least one of the plurality of RF output signals in accordance with a second set of bins; and
   an amplitude of the at least one of the plurality of RF output signals in accordance with a third set of bins.

16. The RF control system of claim 12 wherein the controller operates in a pulse mode of operation to generate an RF output pulse and the controller further comprises:
   a pulse module, the pulse module generating the RF output pulse of the RF signal;
   a ratio control module, the ratio control module communicating with the pulse module, and generating the ratio control signal; and
   an edge control signal, the edge control signal determining characteristics of an edge of the RF output pulse.

17. A controller for a radio frequency (RF) control system, the RF control system including a RF generator having a power amplifier that outputs a RF signal to a matching network, the matching network generating a plurality of RF output signals to a plurality of loads, the matching network including a ratio tuning element to vary a ratio of power between a first of the plurality of RF output signals and a second of the plurality of RF output signals or a value obtained from selected ones of the plurality of RF output signals, the controller communicating a ratio control signal to the matching network, wherein the matching network controls the ratio tuning element in accordance with the ratio control signal.

18. The controller of claim 17 where the matching network further includes a match tuning element to vary an impedance at an output of the RF generator and wherein the controller communicates a tune control signal to the matching network, and the matching network controls the match tuning element in accordance with the tune control signal.

19. The controller of claim 17 wherein the matching network communicates a characteristic signal to the RF generator indicative of a characteristic of a respective RF output signal.

20. The controller of claim 19 wherein the controller receives the characteristic signal and generates the ratio control signal in accordance with the characteristic signal.

21. The controller of claim 17 wherein the controller operates the RF generator in a continuous wave mode or a pulse mode.

22. The controller of claim 21 wherein when the controller operates the RF generator in a pulse mode, the controller:
   stores samples of at least one of the plurality of the RF output signal in a receive buffer;
   transfers the stored samples to preselected bins in a reconstruction buffer in accordance with predefined transfer function; and
   reconstructs the at least one of the plurality of RF signals in accordance with the samples and the reconstruction buffer.

23. The RF controller of claim 22 wherein if a selected bin in the reconstruction buffer has stored in at more than one sample, the controller determines an average for the samples in the selected bin.

24. The controller of claim 23 wherein the controller determines at least one of the following:
   a rise time of the at least one of the plurality of RF signals in accordance with a first set of bins;
   a fall time of the at least one of the plurality of RF signals in accordance with a second set of bins; and
   an amplitude of the at least one of the plurality of RF signals in accordance with a third set of bins.

25. A controller for a radio frequency (RF) control system, the RF control system including a RF generator having a power amplifier that outputs a RF signal, the RF generator generating an output signal to a matching network, the matching network generating an RF output signal to a load, the matching network including an impedance tuning element to vary a pulse edge of a pulsed RF signal, the controller communicating a pulse edge control signal to the matching network, wherein the matching network controls the impedance tuning element in accordance with the pulse edge control signal.

26. The controller of claim 25 further comprising an edge controller, the edge controller receiving a signal that varies in accordance with a rise or a fall of the pulse edge, the edge controller generating a signal to adjust the rise or the fall of the pulse edge, respectively, in accordance with the received signal.

27. The controller of claim 26 wherein the pulse edge control signal varies an impedance between the RF generator and the matching network.

28. The controller of claim 26 further comprising an edge controller, the edge controller receiving a signal that varies in accordance with a transition of the pulse edge, the edge controller generating a signal to control a level or duration of an incremental change the pulse edge in accordance with the received signal.

29. The controller of claim 25 further comprising an edge controller, the edge controller receiving a signal that varies in accordance with a rise or a fall of the pulse edge, the edge controller generating a signal to control at least one of the rise of the pulse edge, fall of the pulse edge, or a level or duration of an incremental change of the pulse edge in accordance with the received signal.

30. The controller of claim 25 wherein the pulse edge control signal is communicated to the pulse controller, the pulse controller generating a command to the matching network to vary the impedance tuning element.

31. The controller of claim 25 wherein the pulse edge control signal varies an impedance between the RF generator and the matching network.

32. A method for controlling a radio frequency (RF) control system, the method comprising communicating a ratio control signal to a matching network, wherein the matching network controls a ratio tuning element in accordance with a ratio control signal, wherein the matching network receives an RF signal and generates a plurality of RF output signals to a plurality of loads, the matching network varying a ratio of power between a first of the plurality of RF output signals and a second of the plurality of RF output signals in accordance with the ratio control signal.

33. The method of claim 32 further comprising varying an impedance at an output of the RF generator by communicating a tune control signal to the matching network, wherein the matching network controls a match tuning element in accordance with the tune control signal.

34. The method of claim 32 further comprising communicating a characteristic signal to the RF generator indicative of a characteristic of a respective RF output signal.

35. The method of claim 34 further comprising receiving the characteristic signal and generating the ratio control signal in accordance with the characteristic signal.

36. The method of claim 32 further comprising operating the RF generator in a continuous wave mode or a pulse mode.

37. The method of claim 36 further comprising when operating the RF generator in a pulse mode:
    storing samples of at least one of the plurality of the RF output signal in a receive buffer;
    transferring the stored samples to preselected bins in a reconstruction buffer in accordance with predefined transfer function; and
    reconstructing the at least one of the plurality of RF output signals in accordance with the samples and the reconstruction buffer.

38. The RF method of claim 37 wherein if a selected bin in the reconstruction buffer has stored in at more than one sample, determining an average for the samples in the selected bin.

39. The method of claim 38 further comprising determining at least one of the following:
    a rise time of the at least one of the plurality of RF output signals in accordance with a first set of bins;
    a fall time of the at least one of the plurality of RF output signals in accordance with a second set of bins; and
    an amplitude of the at least one of the plurality of RF output signals in accordance with a third set of bins.

40. A method for controlling a radio frequency (RF) system, the method comprising controlling generation of a RF signal to a matching network and communicating a pulse edge control signal to the matching network, the matching network controlling an impedance tuning element in accordance with the pulse edge control signal to vary a pulse edge of a pulsed RF signal.

41. The method of claim 40 further comprising receiving a signal that varies in accordance with a rise or a fall of the pulse edge adjusting the rise or fall of the pulse edge, respectively, in accordance with the received signal.

42. The method of claim 41 wherein the pulse edge control signal varies an impedance between a RF generator and the matching network.

43. The method of claim 41 further comprising receiving a signal that varies in accordance with a transition of the pulse edge and adjusting a level or duration of an incremental change in the pulse edge in accordance with the received signal.

44. The method of claim 40 further comprising receiving a signal that varies in accordance with a rise or a fall of the pulse edge and adjusting at least one of the rise of the pulse edge, the fall of the pulse edge, or a level or duration of an incremental change of the pulse edge in accordance with the received signal.

45. The method of claim 40 wherein the pulse edge control signal is communicated to a pulse controller, the pulse controller generating a command to the matching network to vary the impedance tuning element.

46. The method of claim 40 wherein the pulse edge control signal varies an impedance between a RF generator and the matching network or varies a power output by the matching network.

* * * * *